United States Patent
Minagawa et al.

(10) Patent No.: US 8,690,627 B2
(45) Date of Patent: Apr. 8, 2014

(54) ORGANIC EL ELEMENT PRODUCING METHOD COMPRISING ENERGIZATION TREATMENT STEP AND STORAGE TREATMENT STEP

(75) Inventors: Masahiro Minagawa, Niigata (JP); Tetsuya Katagiri, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 212 days.

(21) Appl. No.: 13/377,974

(22) PCT Filed: Jun. 11, 2010

(86) PCT No.: PCT/JP2010/059883
§ 371 (c)(1),
(2), (4) Date: Dec. 13, 2011

(87) PCT Pub. No.: WO2010/150664
PCT Pub. Date: Dec. 29, 2010

(65) Prior Publication Data
US 2012/0088425 A1  Apr. 12, 2012

(30) Foreign Application Priority Data
Jun. 26, 2009 (JP) .................................. 2009-152228

(51) Int. Cl.
*H01J 9/00* (2006.01)
(52) U.S. Cl.
USPC .................................................. 445/6; 445/5
(58) Field of Classification Search
None
See application file for complete search history.

(56) References Cited

U.S. PATENT DOCUMENTS

| | | | |
|---|---|---|---|
| 7,220,603 B2 * | 5/2007 | Hirakata et al. | 438/5 |
| 7,935,544 B2 * | 5/2011 | Takagi et al. | 438/4 |
| 8,012,526 B2 * | 9/2011 | Kidu et al. | 427/66 |
| 2002/0039870 A1 * | 4/2002 | Kaneko et al. | 445/3 |
| 2002/0042152 A1 * | 4/2002 | Yamazaki et al. | 438/4 |
| 2004/0208988 A1 | 10/2004 | Takahashi et al. | |
| 2005/0095740 A1 * | 5/2005 | Hirakata et al. | 438/29 |
| 2007/0057627 A1 | 3/2007 | Kidu et al. | |
| 2007/0281386 A1 | 12/2007 | Park | |
| 2008/0132138 A1 | 6/2008 | Lee et al. | |

FOREIGN PATENT DOCUMENTS

| | | |
|---|---|---|
| JP | 08-315981 A | 11/1996 |
| JP | 2003-282249 A | 10/2003 |
| JP | 2003-282253 A | 10/2003 |
| JP | 2009-140843 A | 6/2009 |

OTHER PUBLICATIONS

Extended European Search Report issued in European Patent Application No. 10791982.1 dated Jul. 8, 2013.

(Continued)

*Primary Examiner* — Britt D Hanley
(74) *Attorney, Agent, or Firm* — McDermott Will & Emery LLP

(57) ABSTRACT

Provided is a method for producing an organic EL element wherein a leak current is reduced, the visual quality is high, and the heat resistance is high. The method for producing an organic EL element formed by holding at least an organic light emitting layer between a pair of electrodes is comprised of an energization treatment process (S3) for energizing the organic EL element while the organic EL element is heated, and a storage treatment process (S4) for storing the organic EL element while the organic EL element is heated. Further, the method for producing an organic EL element is characterized in that the energization treatment process (S3) and the storage treatment process (S4) are performed in an atmosphere having a temperature of 80 DEG C. or more.

9 Claims, 2 Drawing Sheets

(56) References Cited

OTHER PUBLICATIONS

Sevim A O et al: "Post-fabrication electric field and thermal treatment of polymer light emitting diodes and their photovoltaic properties", Organic Electronics, Elsevier, Amsterdam, NL, vol. 10, No. 1, Feb. 1, 2009, pp. 18-26, XP025845800, ISSN: 1566-1199, DOI: 10.1013/J.ORGEL.2008.09.003 [retrieved on Sep. 30, 2008] pp. 20-22.

* cited by examiner

ORGANIC EL ELEMENT PRODUCING METHOD COMPRISING ENERGIZATION TREATMENT STEP AND STORAGE TREATMENT STEP

RELATED APPLICATIONS

This application is the U.S. National Phase under 35 U.S.C. §371 of International Application No. PCT/JP2010/059883, filed on Jun. 11, 2010, which in turn claims the benefit of Japanese Application No. 2009-152228, filed on Jun. 26, 2009, the disclosures of which Applications are incorporated by reference herein.

TECHNICAL FIELD

The present invention relates to methods for producing an organic EL (electroluminescence) element.

BACKGROUND ART

In an organic EL element, a functional layer including at least an organic emissive layer is held between a pair of electrodes (see, for example, Patent Document 1). An organic EL panel including the organic EL element on a substrate has been developed for applications such as in luminescent displays and illuminations. The organic EL element emits light through recombination of holes and electrons in the organic emissive layer upon the injection of the holes from the positive electrode and the electrons from the negative electrode. The organic EL element has a so-called diode characteristic, in which current is unlikely to flow from the negative electrode side to the positive electrode side.

The organic EL element is problematic in the following respect. When a thin defect site occurs in a part of the functional layer as a result of, for example, inclusion of foreign material inside the functional layer in the production process, a current (leak current) flows in the opposite direction from the negative electrode to the positive electrode in response to the voltage applied to the organic EL element during the emission drive. This lowers the display quality of the organic EL element, resulting in, for example, uneven luminance.

In this connection, a method is known in which an energization treatment is performed that applies a voltage between the electrodes after forming the organic EL element in an organic EL element producing step to remove the negative electrode at the defect site causing the leak current, as disclosed in, for example, Patent Document 2. This method enables the defect site of the organic EL element to be removed in advance, and can thus suppress uneven luminance or the like, and stabilize the luminance characteristics of the organic EL element. It is also known that the defect site can be removed more quickly when the energization treatment is performed while heating the organic EL element at room temperature or higher temperatures.

CITATION LIST

Patent Document

Patent Document 1: JP-A-8-315981
Patent Document 2: JP-A-2003-282249

SUMMARY OF THE INVENTION

Problems that the Invention is to Solve

However, the intensive studies conducted by the present inventors revealed that an organic EL element subjected to the energization treatment while being heated becomes unstable against heat, and that the initial luminance greatly lowers with the rising panel temperature during the emission drive. It was also found that these tendencies become particularly prominent in the non-selected (non-light emitting) luminescent pixels of an organic EL panel that includes a plurality of luminescent pixels (organic EL elements).

The present invention has been made under these circumstances, and an object of the invention is to provide a method for producing an organic EL element that has a reduced leak current, high display quality, and high heat resistance.

Means for Solving the Problems

In order to solve the foregoing problems, the present invention provides a method for producing an organic EL element that includes at least an organic emissive layer held between a pair of electrodes. The method includes an energization treatment step of energizing the organic EL element in the heated state, and a storage treatment step of storing the organic EL element in the heated state.

The energization treatment step and the storage treatment step are performed in a temperature atmosphere of 80° C. or more.

Further, the energization treatment step and the storage treatment step are performed in the same temperature atmosphere.

The storage time in the storage treatment step is at least as long as the energization time of the energization treatment step.

The method also includes a cooling treatments step for cooing the organic EL element after the energization treatment step and before the storage treatment step.

Advantage of the Invention

The present invention can provide an organic EL element producing method that can desirably achieve the foregoing object, and can provide an organic EL element that has a reduced leak current, high display quality, and high heat resistance.

MODE FOR CARRYING OUT THE INVENTION

An embodiment of the present invention is described below with reference to the accompanying drawings.

Figure 1:
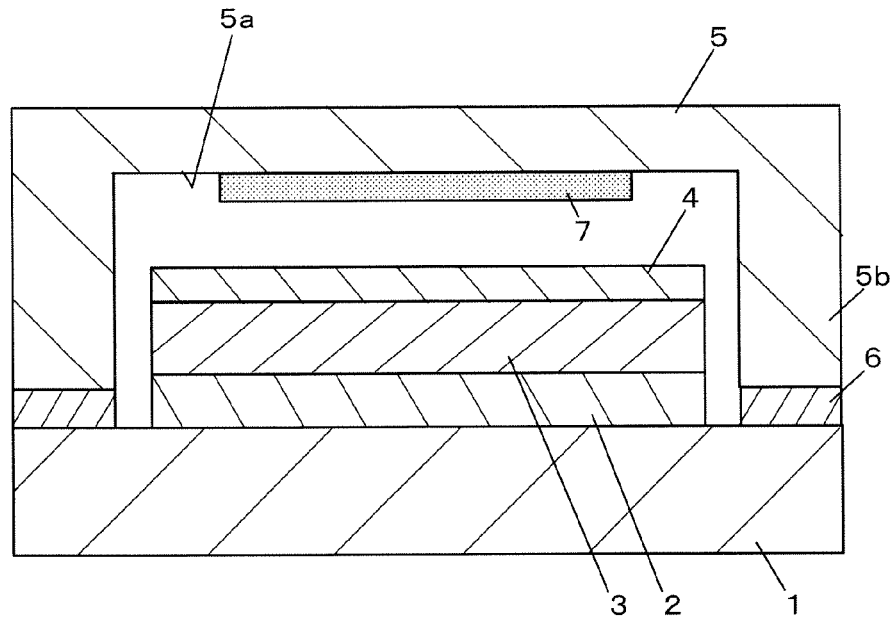
FIG. 1 is a cross sectional view of an organic EL element according to an embodiment of the present invention.

FIG. 1 illustrates an organic EL element of the present embodiment. The organic EL element is used in a variety of applications such as in luminescent displays and illumination means by being formed on a support substrate 1 in a desired shape. The organic EL element includes a first electrode 2, a functional layer 3, and a second electrode 4 successively laminated on the support substrate 1, with the functional layer 3 being held between the electrodes 2 and 4. The organic EL element is sealed with a sealing member 5.

The support substrate 1 is an electrically insulating substrate made of rectangular transparent glass material.

The first electrode 2 is made of translucent conductive material such as ITO, and is formed by layering the translucent conductive material on the support substrate 1 using means such as sputtering, and by desirably shaping the material using a method such as photolithographic etching. In the present embodiment, the first electrode 2 serves as the positive electrode.

The functional layer 3 includes at least an organic emissive layer, and is formed by successively laminating, for example, a hole injection layer, a hole transport layer, an organic emissive layer, an electron transport layer, and an electron injection layer on the first electrode 2 using means such as vapor deposition.

The second electrode 4 is made of metallic conductive material such as aluminum (AL), and magnesium silver (Mg: Ag), and is formed by layering the metallic conductive material on the functional layer 3 using means such as vapor deposition. The second electrode 4 has higher conductivity than the first electrode 2, and, in the present embodiment, serves as the negative electrode.

The sealing member 5 is, for example, a flat member made of glass material, and includes a depression 5a (described later) that houses the organic EL element air-tightly, and a bonded portion 5b formed around the depression 5a and bonded to the support substrate 1 via an adhesive 6. An adsorbing member 7 that adsorbs the moisture in the sealed space is disposed in the depression 5a of the sealing member 5.

Figure 2:
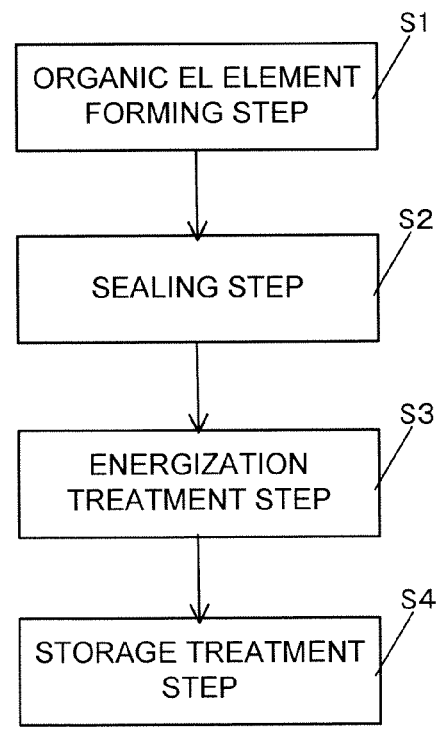
FIG. 2 is a diagram representing a method for producing the organic EL element.

An organic EL element producing method is described below with reference to FIG. 2.

First, in organic EL element forming step S1, a translucent conductive material such as above is layered on the support substrate 1 using means such as vapor deposition and sputtering, and the first electrode 2 is formed by using a method such as photolithographic etching. Then, each layer of the functional layer 3 is laminated over the first electrode 2 in a corresponding fashion using a method such as vapor deposition, and the second electrode 4 is laminated on the functional layer 3 using a method such as vapor deposition to form the organic EL element.

Thereafter, in sealing step S2, the sealing member 5 with the adsorbing member 7 applied to the depression 5a is disposed and fixed on the support substrate 1 via the UV-curable adhesive 6 so as to house the organic EL element. This completes an organic EL panel provided with the organic EL element.

Then, in energization treatment step S3, the electrodes 2 and 4 are connected to an external power supply, and energized with a voltage applied for a predetermined time period to destroy and remove defect sites. This repairs the organic EL element, and thus suppresses the leak current-induced, time-dependent changes in emission luminance and stabilizes the element characteristics. The voltage applied in energization treatment step S3 may be any of a forward bias voltage, a reverse bias voltage, and a waveform voltage as an alternate voltage of forward bias voltage and reverse bias voltage. However, applying a reverse bias voltage is preferred, because it does not cause the organic material of the organic EL element from being degraded upon emission. More easily defect sites can be removed with higher values of the applied voltage. However, the voltage value must be limited to such an extent as not to destroy normal sites, because excessively high voltages also destroy the normal sites. Energization treatment step S3 is performed while heating the organic EL element. The organic EL element may be heated by using a method in which energization treatment step S3 is performed in an atmosphere with a temperature of at least room temperature (desirably 80° C. or more). By heating the organic EL element, the defect site can be exposed, and the voltage application time can be reduced. Note that energization treatment step S3 may be performed simultaneously with an inspection step in which the organic EL element is turned on in a forward bias voltage apply period to determine the quality of the organic EL element.

Thereafter, in storage treatment step S4, the organic EL element is stored for a predetermined time period while being heated, without being energized. The storage time in storage treatment step S4 is preferably at least as long as the energization time in energization treatment step S3. Energization treatment step S3 may be performed more than once. In this case, storage treatment step S4 is performed after the final run of energization treatment step S3. As above, the organic EL element may be heated by performing storage treatment step S4 in an atmosphere with a temperature of at least room temperature (desirably 80° C. or more). Energization treatment step S3 and storage treatment step S4 may be performed in the same temperature atmosphere to simplify the production process. Further, a cooling treatment step for cooling the organic EL element may be included between energization treatment step S3 and storage treatment step S4, provided that storage treatment step S4 is performed after energization treatment step S3 prior to shipping. In this case, the separation of energization treatment step S3 and storage treatment step S4 can make the production process more efficient for mass production or other purposes.

This completes the organic EL element that has a reduced leak current, high display quality, and high heat resistance.

Studies by the present inventors led to the speculation that the functional layer 3 becomes more flexible under the high heat of the high-temperature organic EL element in energization treatment step S3 than when at ordinary temperature, and that the higher applied voltage than that for the emission drive creates an electrostatic attraction force that acts between the electrodes 2 and 4 and crushes the functional layer 3 to increase the film density. It is believed that the emission drive of the organic EL element in this state lowers the film density by the heat of the emission drive, and greatly varies the emission efficiency and drive voltage at initial stages to impair the heat resistance (heat stability), because the applied voltage for the emission drive is lower than the applied voltage in energization treatment step S3, and thus creates a smaller electrostatic attraction force between the electrodes 2 and 4. In contrast, the present inventors found that the storage treatment step S4 provided after energization treatment step S3 to store the organic EL element for a predetermined time period in the heated state could return the film density of the functional layer 3 of the organic EL element to the stable state before energization treatment step S3, and provide an organic EL element that excels in heat resistance.

Figure 3:
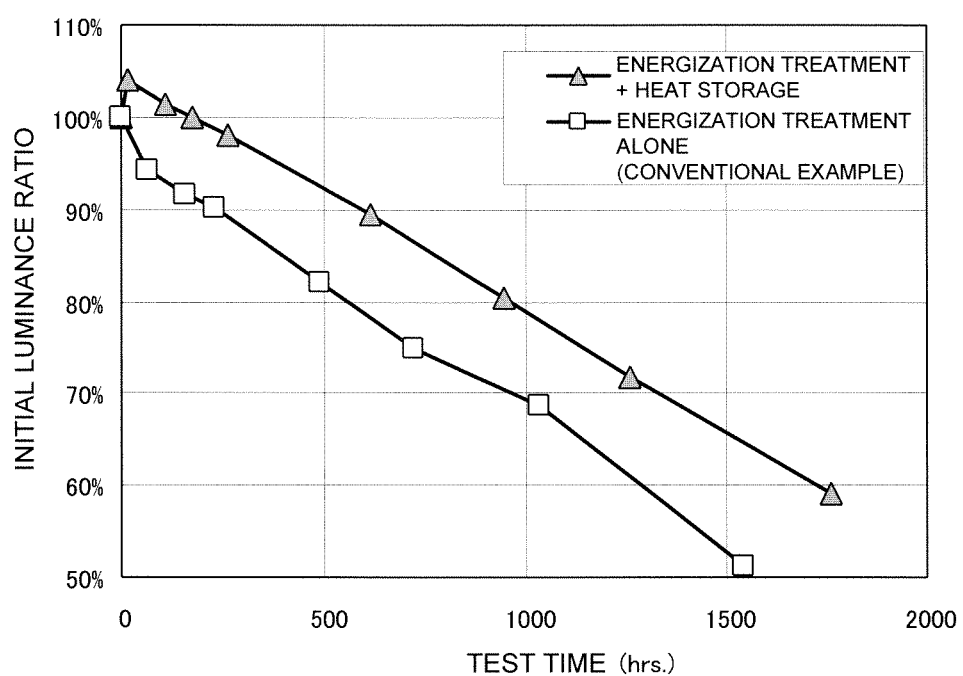
FIG. 3 is a diagram representing the result of an evaluation test for the organic EL element and an organic EL element of Comparative Example.

FIG. 3 represents changes in emission luminance over time in an evaluation test performed at the initial luminance T0 during the emission drive of an organic EL element of Comparative Example (conventional example) for which only energization treatment step S3 was performed, and of the organic EL element of the present embodiment for which storage treatment step S4 was performed after energization treatment step S3. Except for this difference, these organic EL elements had the same configuration, and were produced by using the same method. Note that a reverse bias voltage of −20 to 30 V was applied to the organic EL element of Comparative Example for 2 hours in a duty drive in energization treatment step S3 while heating the organic EL element in a 110° C. temperature atmosphere. For the organic EL element of the present embodiment, a reverse bias voltage of −20 to 30 V was applied for 2 hours in a duty drive in energization treatment step S3 while heating the organic EL element in a 110° C. temperature atmosphere, and the organic EL element was stored in the heated, non-energized state for 2 hours in a 110° C. temperature atmosphere in storage treatment step S4. Referring to FIG. 3, in contrast to the organic EL element of Comparative Example that had a large initial decrease in emission luminance, the organic EL element of the present embodiment suppressed the initial drop in emission luminance, and maintained higher emission luminance than that in Comparative Example. As these test results clearly demonstrate, the present invention can improve the heat resistance of the organic EL element.

INDUSTRIAL APPLICABILITY

The present invention is applicable to a wide range of organic EL element producing methods, and can have effect regardless of the form (including whether the element is of a segment type or dot matrix type), use (including whether used for luminescent displays or illumination means), or the driving mode (including whether passive drive or active drive).

DESCRIPTION OF REFERENCE NUMERALS AND SIGNS

1 Support substrate
2 First electrode
3 Functional layer
4 Second electrode
5 Sealing member
6 Adhesive
7 Adsorbing member
S1 Organic EL element forming step
S2 Sealing step
S3 Energization treatment step
S4 Storage treatment step

The invention claimed is:

1. A method for producing an organic EL element that includes at least an organic emissive layer held between a pair of electrodes,
the method comprising:
an energization treatment step of energizing the organic EL element in a heated state; and
after the energization treatment step, a storage treatment step of storing the organic EL element in a heated state.

2. The method according to claim 1, wherein the energization treatment step and the storage treatment step are performed in a temperature atmosphere of 80° C. or more.

3. The method according to claim 1, wherein the energization treatment step and the storage treatment step are performed in the same temperature atmosphere.

4. A method for producing an organic EL element that includes at least an organic emissive layer held between a pair of electrodes, the method comprising:
an energization treatment step of energizing the organic EL element in a heated state: and after the energization treatment step, a storage treatment step of storing the organic EL element in a heated state,
wherein the storage time in the storage treatment step is at least as long as the energization time in the energization treatment step.

5. A method for producing an organic EL element that includes at least an organic emissive layer held between a pair of electrodes, the method comprising:
an energization treatment step of energizing the organic EL element in a heated state;
a storage treatment step of storing the organic EL element in a heated state; and
a cooling treatment step of cooling the organic EL element after the energization treatment step and before the storage treatment step.

6. The method according to claim 4, wherein the energization treatment step and the storage treatment step are performed in a temperature atmosphere of 80° C. or more.

7. The method according to claim 4, wherein the energization treatment step and the storage treatment step are performed in the same temperature atmosphere.

8. The method according to claim 5, wherein the energization treatment step and the storage treatment step are performed in a temperature atmosphere of 80° C. or more.

9. The method according to claim 5, wherein the energization treatment step and the storage treatment step are performed in the same temperature atmosphere.

* * * * *